United States Patent [19]

Breedis et al.

[11] Patent Number: 4,500,028

[45] Date of Patent: Feb. 19, 1985

[54] METHOD OF FORMING A COMPOSITE MATERIAL HAVING IMPROVED BOND STRENGTH

[75] Inventors: John F. Breedis, Trumbull; Julius C. Fister, Hamden, both of Conn.

[73] Assignee: Olin Corporation, New Haven, Conn.

[21] Appl. No.: 546,665

[22] Filed: Oct. 28, 1983

Related U.S. Application Data

[62] Division of Ser. No. 392,999, Jun. 28, 1982, Pat. No. 4,429,022.

[51] Int. Cl.$^3$ ............................................. B23K 20/04
[52] U.S. Cl. ................................. 228/117; 228/243; 228/263.18
[58] Field of Search ........... 228/117, 235, 243, 263.18; 420/492

[56] References Cited

U.S. PATENT DOCUMENTS

| | | | |
|---|---|---|---|
| 2,691,815 | 10/1954 | Boessenkool et al. | 228/117 |
| 2,753,623 | 7/1956 | Boessenkool et al. | 228/243 X |
| 2,767,467 | 10/1956 | Siegel | 228/243 X |
| 2,842,438 | 7/1958 | Saarivirta et al. | 420/492 |
| 3,251,660 | 5/1966 | Finsterwalder | 428/675 |
| 3,259,491 | 7/1966 | Pryor | 75/162 |
| 3,341,369 | 9/1967 | Caule et al. | 148/3 |
| 3,381,364 | 5/1968 | Winter | 228/235 X |
| 3,381,365 | 5/1968 | Winter | 228/235 X |
| 3,381,366 | 5/1968 | Winter | 228/235 X |
| 3,397,045 | 8/1968 | Winter | 428/612 |
| 3,470,607 | 10/1969 | Rader et al. | 228/117 |
| 3,475,227 | 10/1969 | Caule et al. | 148/6.31 |
| 3,496,621 | 2/1970 | Winter | 428/643 |
| 3,496,625 | 2/1970 | Winter | 428/675 |
| 3,516,804 | 6/1970 | Trapp et al. | 420/485 |
| 3,634,926 | 1/1972 | Winter | 228/235 X |
| 3,676,088 | 7/1972 | Pryor et al. | 428/655 |
| 3,721,535 | 3/1973 | Pryor et al. | 428/925 |
| 3,750,253 | 8/1973 | Miller | 428/637 |
| 3,753,669 | 8/1973 | Churchill | 428/671 |
| 3,767,370 | 10/1973 | Ornstein | 428/617 |
| 4,330,599 | 5/1982 | Winter et al. | 428/675 |

OTHER PUBLICATIONS

Covington, Mary W., "Heat Treating Copper and Copper Alloys", *Metal Progress*, vol. 105, May 1974, pp. 75, 76 And 78.

Lyman, Taylor, et al., *Metals Handbook*, vol. 2, 8th Edition, pp. 284-292.

*Primary Examiner*—Kenneth J. Ramsey
*Attorney, Agent, or Firm*—Barry L. Kelmachter; Howard M. Cohn; Paul Weinstein

[57] ABSTRACT

A composite material having improved bond strength and a substantially smooth external surface comprises a deoxidized copper alloy core material and a copper-aluminum-silicon clad material. The composite is formed by rolling together the core and clad, preferably in an unheated condition, in a single pass with a reduction of about 50% to 75% to form a metallurgical bond between the core and clad and thereafter enhancing the bond strength by heating the bonded core and cladding to a temperature in the range of about 200° C. to about 750° C. for a time period of about 5 minutes to about 24 hours.

8 Claims, No Drawings

METHOD OF FORMING A COMPOSITE MATERIAL HAVING IMPROVED BOND STRENGTH

This application is a division of application Ser. No. 392,999, filed June 28, 1982, now U.S. Pat. No. 4,429,022.

This invention relates to a composite material having improved bond strength and a process for making the composite material.

Composite metal laminates have found wide use commercially in a variety of applications. Composite metal articles having a dissimilar core and cladding are highly desirable commercially due to the fact that the beneficial characteristics of the core and cladding may be obtained in one composite article. In a single material or alloy frequently many properties cannot be greatly modified by alloying or thermal treatments, for example, such properties as modulus of elasticity, color, density and strength in combination with high thermal or electrical conductivity. However, by forming composites apparent properties of the cladding can be generated while the bulk properties of the core materials are retained. In this manner, one can often obtain greatly modified and highly desirable properties over a single alloy at a reasonable cost.

For example, copper has the advantage of high electrical and thermal conductivity and cold formability. By forming copper composites, one can retain these desirable properties while generating properties of the cladding, such as wear resistance, color, oxidation or tarnish resistance and fine finishing, i.e. surface quality. Various uses to which composite copper articles may be put include high conductivity, high strength springs, highly efficient electrical contactors, improved chip carriers for printed circuit board applications, hardware involving extensive cold forming, and coinage material.

The preparation of composite copper materials having sufficient bond strength and surface properties for the above-identified uses has presented numerous difficulties. First, there is the problem of preparing a composite laminate in a simple and convenient manner so as to insure a well bonded laminate. In particular, there is the problem of metallurgically bonding copper materials which are characterized by vastly different work hardening characteristics and obtaining a well bonded laminate which is not characterized by surface waves or breaks. Furthermore, when such composites are used for coinage materials, requirements are severe with regard to materials and characteristics of the composites.

Several methods for providing metallurgically bonded composites formed from a wide variety of materials have been proposed. For example, U.S. Pat. Nos. 2,691,815, 2,753,623, 2,767,467 and others are characterized by providing a poorly bonded laminate or a green bond followed by annealing treatments to improve the metallurgical bond. Some objections to this method have been raised because the subsequent diffusion annealing process tends to degrade the properties of certain composites. Various composites formed by this method are illustrated in U.S. Pat. Nos. 3,251,660, 3,8750,253, 3,753,669 and 3,767,370. These patents also illustrate the wide variety of materials from which composites are formed. For example, U.S. Pat. No. 3,251,660 discloses a composite having a copper layer sandwiched between layers formed of an age hardenable or precipitation hardenable stainless steel or an age hardenable or precipitation hardenable nickel base alloy. U.S. Pat. No. 3,750,253 proposes a core layer of low carbon steel, a relatively thin layer of nickel silver metallurgically bonded to each side of the core layer, and a relatively very thin layer of nickel metallurgically bonded to the outer surface of each of the layers of nickel silver. U.S. Pat. No. 3,753,669 proposes outer cladding layers of coin silver or cupronickel metallurgically bonded to opposite sides of a core layer of nickel silver. U.S. Pat. No. 3,767,370 discloses a multilayer composite thermostat material having a core layer formed by a copper alloy including a preselected amount of zirconium, a preselected amount of chromium, or a preselected amount of tellurium and a trace amount of phosphorous and outer layers formed by either an iron alloy or a manganese alloy.

U.S. Pat. No. 3,470,607 illustrates a two-step rolling approach for forming a composite. In this approach, the core and cladding are first cold rolled together to form a poorly-bonded laminate. The poorly-bonded laminate is then cold rolled with a reduction at least 5% in excess of that required to achieve maximum hardness of the core to form a fully-bonded composite. This approach may be used to form a composite from a wide range of materials including a copper core material and a dissimilar copper base alloy cladding material.

Several procedures have been proposed for preparing metal laminates utilizing a single high reduction rolling pass which results in a well bonded metal laminate. Typical among these are U.S. Pat. Nos. 3,381,364, 3,381,365, 3,381,366, 3,397,045, 3,496,621, 3,496,625, 3,634,926 and 3,676,088 for example. In this approach, the core is heated to an elevated temperature followed by rolling together the heated core and a cold cladding at a high speed, such as at least 100 feet per minute, in one pass at a specified high reduction with the core and cladding preferably coming together for the first time in the bite of the rolls and with the cladding contacting the roll prior to contacting the core. Alternatively, the components may be rolled together in direct face-to-face contact in one pass at a high reduction with the reduction being sufficient to cause one of the components only to recrystallize with the recrystallization occurring either at the bite of the rolls or immediately upon exit from the rolls. These methods are effective in providing well bonded metal laminates in a convenient and commercially viable procedure for a wide variety of materials. One such composite formed by this approach is illustrated in U.S. Pat. No. 3,721,535. The composite disclosed therein comprises a copper alloy core containing from 2 to 12 percent by weight aluminum, balance essentially copper, clad with copper or a high copper alloy containing at least 95 percent copper. It has been found that when these procedures have been used with certain materials, wavy or cracked surface finishes may be obtained. This seriously detracts from the usefulness of these procedures.

Yet another approach for forming composites from dissimilar copper base alloy core and clad materials is illustrated in U.S. Pat. No. 4,330,599 and U.S. patent application Ser. No. 303,803 filed Sept. 21, 1981 to Winter et al., now U.S. Pat. No. 4,362,262, which is a division of U.S. Pat. No. 4,330,599. In this approach, the composite is formed by first providing a copper base alloy core material in hard temper having an initial strength of at least 51,000 psi yield strength at 0.2% offset and a copper base alloy clad material fully annealed to an average grain size of at least 10 microns and having an initial maximum strength of less than 15,000 psi yield strength at 0.2% offset. The bond is then formed by rolling together the core in an unheated condition and the cladding in a single pass with a reduction of 50% to 75%. This composite has been found to be particularly useful for making coins having a gold-simulated color.

Recently, there has been substantial interest in composites formed with copper-aluminum-silicon clad material. Copper-aluminum-silicon alloys are well known in the art as illustrated by U.S. Pat. Nos. 3,259,491, 3,341,369 and 3,475,227. It is believed that copper-aluminum-silicon alloys exhibit better adhesion to plastics and sealing glasses than copper. By cladding these copper-aluminum-silicon alloys to a copper core material, the resulting composite can be used where good electrical and thermal conductivities are required, such as in lead frames and other electronic components. Furthermore, the gold coloration of the copper-aluminum-silicon alloy makes such a composite applicable for use as coinage material. In many of these applications, it is important that the composite possess a high bond strength. U.S. patent application Ser. No. 369,785, filed Apr. 19, 1982 to Butt demonstrates one application for a composite having a copper-aluminum-silicon alloy clad to a copper core material.

Composites of copper-aluminum-silicon alloys with unalloyed coppers, e.g. C10200 and C11000, have been made using the aforementioned prior art processes. When subjected to post-bond processing such as annealing, these composites have exhibited low bond strength. This low bond strength has been attributed to such factors as grain boundary porosity in the copper component near the clad/core interface and embrittlement caused by residual oxygen in the core material.

In accordance with the instant invention, it has been found that the aforenoted low bond strength problem may be avoided by using certain deoxidized copper alloys, e.g. C15100, as the core material. Composites formed with such a core material exhibit significantly improved bond strength and improved resistance to embrittlement. Metallographic evaluation of composites having such a deoxidized copper alloy core material has revealed a substantially complete absence of porosity or cracking in the core component.

The present invention comprises a composite material exhibiting improved bond strength and having a copper alloy core material and a cladding metallurgically bonded thereto. The cladding material preferably comprises a copper base alloy containing from about 2 to 3.5% aluminum, from about 1 to 2.5% silicon and the balance essentially copper. The copper alloy core material preferably comprises a low work hardened, deoxidized, high copper content alloy. The core material contains at least 95% copper and in a preferred embodiment, at least 99% copper. Additionally, the core material contains up to about 0.5% by weight zirconium.

The composite metal laminate of the present invention also has good electrical and thermal conductivity properties and a gold-simulated color suitable for coinage. Naturally, the core may be clad on one or both sides. If a coinage material is contemplated, the core should be clad on both sides with the cladding material.

The method of the present invention for forming metallurgically bonded composites has been found to effectively provide a composite material having both improved bond strength and a substantially smooth external surface. In accordance with the method of the present invention, a deoxidized copper core material containing at least 95% copper in strip form is provided. A cladding comprising a dissimilar copper alloy material in strip form is provided. The components are then rolled together, preferably in an unheated condition, in a single pass with a reduction of about 50% to 75% to form a metallurgical bond between the core and the cladding. Preferably, the core and cladding or claddings enters the rolls at an angle of from 5° to 22° and come together for the first time in the bite of the rolls. Thereafter, the bonded core and cladding are heated to a temperature in the range of about 200° C. to about 750° C. for a time period of about 5 minutes to 24 hours.

It has been surprisingly found that composites formed in accordance with the instant invention exhibit bond strengths after the heat treatment step an order of magnitude greater than the bond strengths exhibited by composites using an unalloyed copper core material. It has also been found that composites formed in accordance with the instant invention substantially retain their bond strength when subjected to further processing such as cold working.

The resultant well-bonded laminate has a smooth external surface, less porous grain boundaries, more detritus-free regions and a desirable gold-simulated color. The resultant well-bonded laminate may be cold rolled to any desired finish gage.

Accordingly, it is an object of the present invention to provide a composite material having improved bond strength.

It is still a further object of the present invention to provide such a material having a substantially smooth surface finish and a gold-simulated color.

It is still a further object of the present invention to provide a method of forming such a material which is inexpensive and easy to practice.

Further objects and advantages of the present invention will appear hereinbelow.

The composite of the present invention as described generally hereinabove has a deoxidized copper alloy core clad with a specifically defined dissimilar copper alloy. The copper alloy core is preferably a deoxidized, high copper content alloy such as C15100. The copper alloy core material contains at least 95%, and preferably in excess of 99%, by weight copper and up to 0.5% by weight, preferably about 0.05% to 0.15%, zirconium. In a preferred embodiment, copper alloy C15100, which contains about 0.1% zirconium and the balance essentially copper, is used as the core material. The dissimilar cladding material is preferably a copper alloy containing from about 2 to 3.5% aluminum, preferably about 2 to 3% aluminum, and from about 1 to 2.5% silicon, preferably about 1 to 2% silicon, with the balance essentially copper. Copper alloy C63800 is a suitable cladding material. Conventional impurities may of course be tolerated in this alloy. Also, alloying additions may be added to achieve particularly desirable properties.

In accordance with the method of the present invention, a well-bonded composite having improved bond strength is obtained using copper alloy core and copper alloy cladding materials as set out hereinabove. While the preferred embodiment utilizes a deoxidized, high copper content alloy for the core and a copper-aluminum-silicon alloy for the cladding having the compositions set out hereinabove, the method of the present invention is not limited to these preferred components and other copper or copper alloy materials may be employed.

As previously indicated, the metallurgically bonded composite is obtained by rolling together the core and cladding in strip form in a single pass with a reduction of from about 50 to about 75% and thereafter subjecting the bonded core and cladding to a heat treatment at a temperature in the range of about 200° C. to about 750° C., preferably from about 400° C. to about 600° C. for a time period of about 5 minutes to 24 hours, preferably from about 30 minutes to 1 hour. If necessary, additional cold working of the composite may be performed after the heat treatment without significantly degrading the bond strength of the composite.

Composites formed using prior art approaches have encountered such problems as low bond strength and objectionable and pronounced waviness in the surface of the final composite. The waviness in its most severe form manifests itself in serious cracks leaving the core exposed. Normal methods to overcome the waviness problem, such as increased back tension, increased friction at the roll/composite surface, and changing core-clad ratios have been unsuccessful in alleviating this problem. It is believed that the waviness which may result and which is described above is related to a difference in the work hardening rate of the cladding versus the core. The problem is exaggerated by the tension induced in the surface layers being opposed by compressive forces in the core during the rolling step.

The problem of low bond strength is believed to be the result of several factors including long continuous grain boundary cracks, a layer of detritus at the interface, and degradation of the interface as the result of residual oxygen in the core material. In certain composites, embrittlement is believed to be due to the reduction of copper oxide by hydrogen diffusion from the clad. The embrittlement may also be due to pressures from bonding which fracture copper oxide/copper bonds.

In accordance with the instant invention, the problem of embrittlement and low bond strength may be avoided by using certain deoxidized copper alloy core materials. The above-noted mechanisms that cause embrittlement do not operate when such deoxidized copper alloy core materials are used. It has been found that by using such core materials the bond strength may be increased by an order of magnitude as compared to other composites, the number of detritus free regions may be improved and the grain boundaries may be improved.

Furthermore, it has been found that surface waviness can be avoided and a firmly-bonded composite obtained when the composite is formed using the above-noted materials. Thus, as indicated hereinabove, the core strip comprises a deoxidized copper alloy and the cladding is in strip form and preferably comprises a copper-aluminum-silicon alloy. The core and cladding materials may have any desired temper. In a preferred embodiment, a hard temper core material is used.

The core and cladding are rolled together in a single pass with a reduction of about 50 to about 75% to provide a metallurgically bonded composite and thereafter the composite is subjected to a heat treatment, such as a bell anneal, at a temperature of about 200° C. to about 750° C. for at least about 5 minutes to about 24 hours. Preferably, the core is clad on both sides. The core material represents from 40 to 90% of the thickness of the composite and the cladding from 10 to 60% of the thickness of the composite. Generally, the cladding is from 5 to 30% of the thickness of the composite on each side of the core. In the preferred embodiment, the final gage of the composite is from 0.01" to 0.1". Naturally, after the heat treatment step, the resultant composite may be subjected to further cold working with a reduction up to about 85% without significantly reducing the bond strength. For example, the composite may be rolled to final gage.

In the preferred embodiment, upon entering the rolls an angle is provided between the core and cladding in excess of 5°, and generally in excess of 10°, in order to insure that the core and cladding or claddings will not come together earlier than in the bite of the rolls. This is not essential, however, although it is preferred. Generally, the included angle between the core and cladding is between 5° and 22°.

In accordance with the preferred embodiment of the present invention, the cladding material contacts the roll prior to contacting the core material. This is true whether the core is to be clad on one side or both sides. On the front side of the rolls, the entry side, the claddings and the rolls are traveling at different linear speeds; whereas, at the exit side they are going at the same speed due to the reduction in thicknesss of the composite. The difference in traveling speeds between the cladding and the rolls, coupled with the precontact between the cladding and the rolls, generates a shearing strain to the core-clad interface. The shear strain at the core-clad interface results in turbulent flow of metal at the interface which causes an intimate bonding and increases the interfacial linear surface of the composite by generally 20% or more. The core material is able to sustain a very large reduction of up to 75% by dynamically recrystallizing in the bite of the rolls.

Prior to the bonding reduction, the core material is preferably provided in plate form having a thickness less than ½" and the cladding material preferably in plate form less than ¼" in thickness. Surface oxides, unless massive, are generally no handicap to the process of the present invention. It is, however, desirable to remove dirt or adhering lubricant from the surface of the material prior to the bonding step in order to assure good frictional contact between the core and cladding.

Subsequent to the bonding step, the composite is subjected to a heat treatment at a temperature from about 200° C. to 750° C. for at least about 5 minutes and up to about 24 hours. In a preferred embodiment, the heat treatment is performed at a temperature of about 400° C. to about 600° C. for a time period of about 30 minutes to about 1 hour. The rates for heating up and cooling down the composite are not important to the present invention. The heat treatment may be performed using any conventional apparatus known in the art. It has been found that this heat treatment significantly improves the bond strength of a composite formed from the materials described hereinbefore.

Subsequent to the heat treating step, no further operations whatever are required. The composites are provided in a form ready to be used. It may naturally be desired to perform conventional subsequent operations for particular applications. For example, rolling operations for dimensional control, additional thermal treatments, and so forth may be performed. It has been surprisingly found that rolling operations with a reduction up to 85% may be performed without significantly reducing the bond strength of the composite.

The present invention will be more readily understandable from a consideration of the following illustrative examples.

EXAMPLE I

A tri-clad composite was formed using copper alloy C15100 as the core material. Copper alloy C15100 consists of about 0.1% zirconium, the balance essentially copper. The composition of the cladding material on both sides of the core consisted of about 2.5% aluminum, about 1.5% silicon and the balance essentially copper. The core material comprised about 50% of the composite thickness and the cladding on each side comprised about 25% of the composite thickness.

For the purpose of comparison, a tri-clad composite was formed using copper alloy C11000 as the core material. The same clad alloy composition was used. The composite had substantially the same core and cladding thicknesses as the C15100-containing composite.

Both composites were formed using the method described hereinabove. The cores and claddings were rolled together at a reduction of about 65% in a single pass and in an unheated condition. After bonding, the composites were annealed at 600° C. for one hour. Thereafter, they were cold rolled to obtain various cold rolling levels. Peel tests were done on ¾" wide samples which had been sheared from the bonded composite.

The as-bonded condition before annealing was characterized by low bond strength for both composites as demonstrated by the ability to peel them apart by hand. The composites exhibited a bond strength up to about 40 pounds per ¾ inch test width. This bond strength is typical of hand peelable composites.

The bond strengths of both composites were increased by the anneal. However, the bond strength of the C15100-containing composite was about five times greater than that of the C11000-containing composite. The bond strength was near 500 pounds per test width for the C15100-containing composite and was near 100 pounds per test width for the C11000-containing composite.

The bond strength of the C15100-containing composite was substantially retained with cold rolling after the anneal, whereas the bond strength of the C11000-containing composite was reduced significantly. For example, in one sample, the C15100-containing composite had a bond strength of 260 pounds per test width after a cold reduction of 15%. In other samples, the C15100-containing composite could not be peeled even after cold reductions of up to 85% after the anneal. In contrast, the C11000-containing composite had its bond strength reduced to near 30 pounds per test width after a 20% cold reduction. Further cold reduction did not increase the bond strength of the C11000-containing composite.

Metallographic evaluation of the annealed C15100-containing composite revealed a substantially complete absence of porosity or cracking in the core component. This result was consistent with the observed higher bond strength of the C15100-containing composites.

The data from this test show that the C15100-containing composite exhibits almost an order of magnitude improvement in bond strength over the C11000-containing composite. This improvement is evident immediately after annealing and also after subsequent cold rolling of the annealed composite. C15100-containing composites formed in accordance with this example could be bent 90° without delaminating. In addition, the composite showed an absence of substantially any surface waviness.

EXAMPLE II

A bi-clad composite was formed using alloy C15100 as the core material. The cladding material was the same as that used in the previous example. The core material comprised about 80% of the composite thickness.

The composite was formed using the same method as in Example I. The core and cladding were rolled together at a reduction of about 65% in a single pass and in an unheated condition. After bonding, the composite was subjected to a bell anneal at 600° C. for one hour.

The as-bonded composite had a relatively low bond strength in the range of about 26 to 33 pounds per ¾" test width. The bond strength improved to 200–226 pounds per ¾" test width after the anneal. Hereto, the composite showed an absence of substantially any surface waviness.

The patents and patent applications set forth in the specification are intended to be incorporated by reference herein.

It is apparent that there has been provided in accordance with this invention a composite material having improved bond strength and a process for making the same which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A method of forming a composite sheet material having improved bond strength and a substantially smooth external surface, said method comprising:
    providing a core material in strip form comprising a deoxidized copper alloy consisting essentially of at least 95% by weight copper and from about 0.05% to about 0.5% zirconium;
    providing a cladding material in strip form comprising a dissimilar copper alloy;
    rolling together said core and cladding materials in a single pass with a reduction of about 50% to 75% to form a metallurgical bond between said core and cladding materials; and
    heating said bonded core and cladding materials to a temperature in the range of about 200° C. to about 750° C. for a time period of about 5 minutes to about 24 hours to increase the bond strength of said composite material.

2. The method of claim 1 wherein said core providing step comprises: providing said core material in a low work hardened condition.

3. The method of claim 1 wherein said cladding providing step comprises:
    providing a copper alloy clad material consisting essentially of about 2 to 3.5% aluminum, about 1 to 2.5% silicon, and the balance essentially copper.

4. The method of claim 1 wherein said heating step comprises:
    heating said core and cladding material to a temperature in the range of about 400° C. to about 600° C. for a time period of about 30 minutes to about 1 hour.

5. The method of claim 1 further comprising:

cladding said core material on two opposed surfaces with said cladding material.

6. The method of claim 1 further comprising:
cold working said heat treated composite with a reduction up to 85% without substantially reducing said bond strength.

7. The method of claim 1 wherein said rolling step comprises:
rolling said core and cladding together in an unheated condition.

8. A method of forming a composite sheet material having improved bond strength and a substantially smooth external surface, said method comprising:
providing a copper core material in strip form and in a low work hardened condition, said core material comprising a deoxidized copper alloy consisting essentially of from about 0.5% to about 0.15% zirconium and the balance essentially copper;
providing a cladding material in strip form comprising a dissimilar copper alloy;
rolling together said core and cladding materials in a single pass with a reduction of about 50% to 75% to form a metallurgical bond between said core and cladding materials; and
heating said bonded core and cladding materials to a temperature in the range of about 200° C. to about 750° C. for a time period of about 5 minutes to about 24 hours to increase the bond strength of said composite material.

* * * * *